United States Patent
Shih et al.

(10) Patent No.: US 6,997,217 B2
(45) Date of Patent: Feb. 14, 2006

(54) GAS CONDUIT FOR A LOAD LOCK CHAMBER

(75) Inventors: Shih-Hao Shih, Hsinchu (TW); Wei-Chen Chen, Hsinchu (TW); Chi-Chen Luo, Hsinchu (TW); Hsin-Cheng Liu, Hsinchu (TW); Andy Lin, Hsinchu (TW)

(73) Assignee: Macronix International Co., Ltd., Hsin-Chu (TW)

( * ) Notice: Subject to any disclaimer, the term of this patent is extended or adjusted under 35 U.S.C. 154(b) by 328 days.

(21) Appl. No.: 10/289,414

(22) Filed: Nov. 7, 2002

(65) Prior Publication Data

US 2003/0213143 A1    Nov. 20, 2003

(30) Foreign Application Priority Data

May 15, 2002    (TW) .............................. 91206947 U

(51) Int. Cl.
    *B65B 1/04*    (2006.01)
(52) U.S. Cl. ........................ 141/98; 141/66; 414/217; 414/291; 414/935
(58) Field of Classification Search ................. 141/98, 141/63–67; 414/217, 291, 935, 937; 118/715; 134/1.1, 1, 19, 21, 34
    See application file for complete search history.

(56) References Cited

U.S. PATENT DOCUMENTS

| | | | |
|---|---|---|---|
| 6,135,168 A * | 10/2000 | Yang et al. .................... | 141/98 |
| 6,368,411 B1 * | 4/2002 | Roberson, Jr. et al. ..... | 118/715 |
| 6,715,495 B1 * | 4/2004 | Dao et al. .................... | 134/1.1 |
| 6,758,876 B1 * | 7/2004 | Suzuki et al. .............. | 55/385.6 |

* cited by examiner

*Primary Examiner*—Steven O. Douglas
(74) *Attorney, Agent, or Firm*—Birch, Stewart, Kolasch & Birch, LLP

(57) ABSTRACT

A gas conduit for a load lock chamber. The gas conduit connects to a gas source to introduce gas from the gas source into the load lock chamber of semiconductor equipment. The structure includes a filter mounted on the top surface of the load lock chamber, a pressure limitative device to maintain a preset pressure of gas source, and a gas inlet device including an inlet end connected to the pressure limitative device and an outlet end connected to the filter, wherein the gas inlet device introduces gas from the gas source into the load lock chamber with its maximum flow rate when breaching the vacuum therein.

14 Claims, 4 Drawing Sheets

GAS CONDUIT FOR A LOAD LOCK CHAMBER

BACKGROUND OF THE INVENTION

1. Field of the Invention

The present invention relates to a gas conduit for a load lock chamber, and more particularly, to a gas conduit which can introduce gas into the load lock chamber with its maximum flow rate.

2. Description of the Related Art

Many semiconductor processes are conducted in vacuum, such as implantation and chemical vapor deposition (CVD). In order to maintain the vacuum in a reaction area, there must be a buffer area disposed in semiconductor equipment to switch the pressure therein from vacuum to 1 AMT. This buffer area is called the load lock chamber and accepts finished wafers from the reaction area or half-finished wafers delivered by a standard mechanical interface (SMIF).

FIG. 1 is a schematic drawing of semiconductor equipment with a conventional gas conduit. In FIG. 1, the SMIF 40 delivers the cassette 21 from the pod 20 to semiconductor equipment 10 or back to the pod 20. The SMIF 40 can open the pod 20, and place the cassette 21 on the support 41. Semiconductor equipment 10 has a load lock chamber 30 with two movable doors 34, 12, a buffer chamber 11 and a reaction chamber 14 and a robot arm 13. The doors 34 and 12 separate the load lock chamber 30 from the buffer chamber 11 and the SMIF 40. When the door 34 opens, cassette 21 are delivered from the SMIF 40 into the load lock chamber 30 and placed on the indexer 31. The door 34 closes, and an air-extracting device (not shown) pumps out the air and evacuates the load lock chamber. When the load lock chamber 30 reach base pressure. At the same time, the door 12 opens, and the robot arm 13 delivers half-finished wafers from cassette 21 into the reaction chamber 14 alternately to continue a predetermined process.

When all of the wafers in the load lock chamber 30 have finished the process. The load lock chamber 30 introduces gas to switch the pressure therein back to 1 atm., and then the door 34 opens so that the wafers in the cassette 21 are not damaged by the pressure change.

The inlet flow of the conventional load lock chamber 30 is controlled by a gas inlet assembly 33. The gas inlet assembly 33 includes a main pipe with a fast speed valve 333 and a bypass pipe with a limitative valve 332 and a low speed valve 331. When breaking vacuum in the load lock chamber 30, gas is introduced through the bypass pipe first. The flow speed is limited by limitative valve 332 until the pressure therein becomes larger than a predetermined pressure (ex: 200 Torr.). After the pressure increases, the bypass pipe is closed. At the same time, the fast speed valve 333 opens. The load lock chamber 30 continues introducing gas through the main pipe with the maximum flow rate of the fast speed valve 333 until the pressure becomes 1 atm.

Because the load lock chamber 30 does not introduce gas with its maximum flow rate at first, the gas introduction time increases. The average production time of each wafer is increased. Furthermore, the pipes are costly, and the control methods are more complicated.

Referring to FIG. 1 and FIG. 2, there is a filter 32 connected to the gas inlet assembly 33 and mounted on the bottom surface of the load lock chamber 30. The filter 32 is metal net with large holes which cannot filter out small particles. Furthermore, the air passing through the filter 32 mounted on the bottom surface of the load lock chamber 30 may easily disturb the particles deposited thereon, causing defects on wafers.

SUMMARY OF THE INVENTION

Accordingly, the object of the present invention is to provide an improved gas conduit for the load lock chamber. The improved gas conduit shortens the gas introduction time and avoids disturbing the particles in the load lock chamber, reducing costs and improving the quality of wafers.

The present invention provides a gas conduit connected to a gas source to introduce gas into a load lock chamber of semiconductor equipment, comprising a filter mounted on the top surface of the load lock chamber, a pressure limitative device to maintain a preset pressure in the load lock chamber, and a gas inlet device including an inlet end connected to the pressure limitative device and an outlet end connected to the filter. The gas inlet device introduces gas from the gas source into the load lock chamber with its maximum flow rate when breaching the vacuum therein.

Further scope of the applicability of the present invention will become apparent from the detailed description given hereinafter. However, it should be understood tat the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings, which are given by way of illustration only, and thus are not limitative of the present invention, and in which.

DETAILED DESCRIPTION OF THE INVENTION

Figure 1:
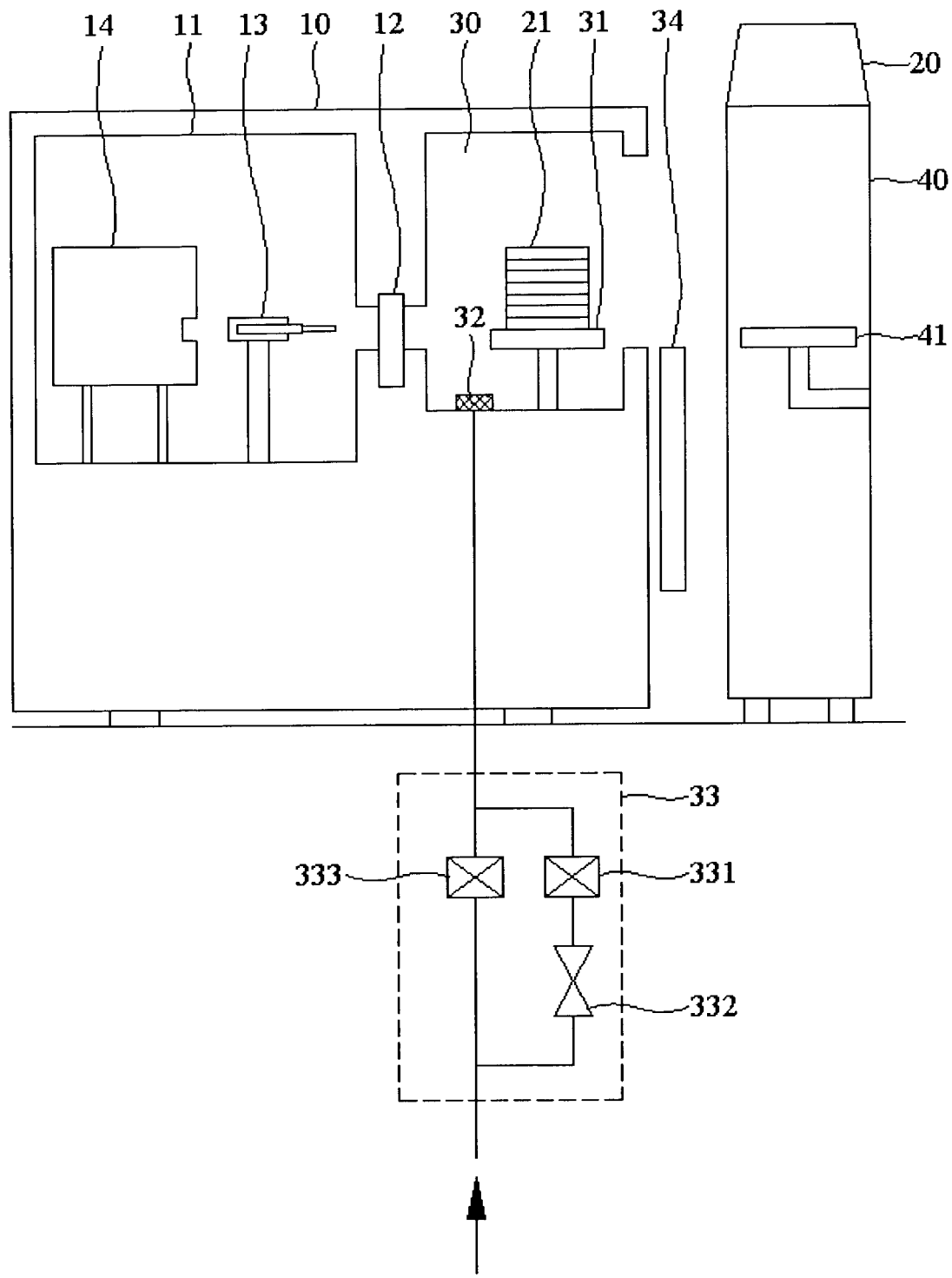
FIG. 1 (Prior Art) is a schematic drawing of semiconductor equipment with a conventional gas conduit.
Figure 2:
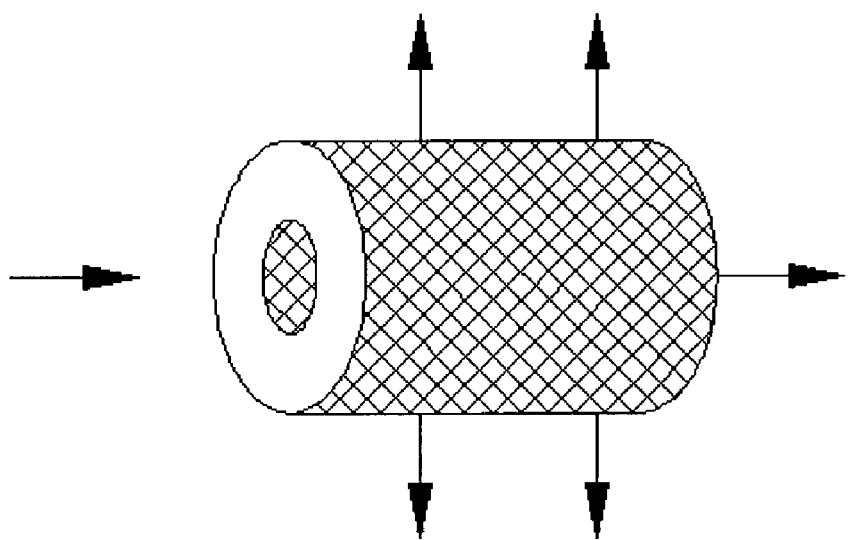
FIG. 2 (Prior Art) is the schematic drawing of a filter of conventional gas conduit.
Figure 3:
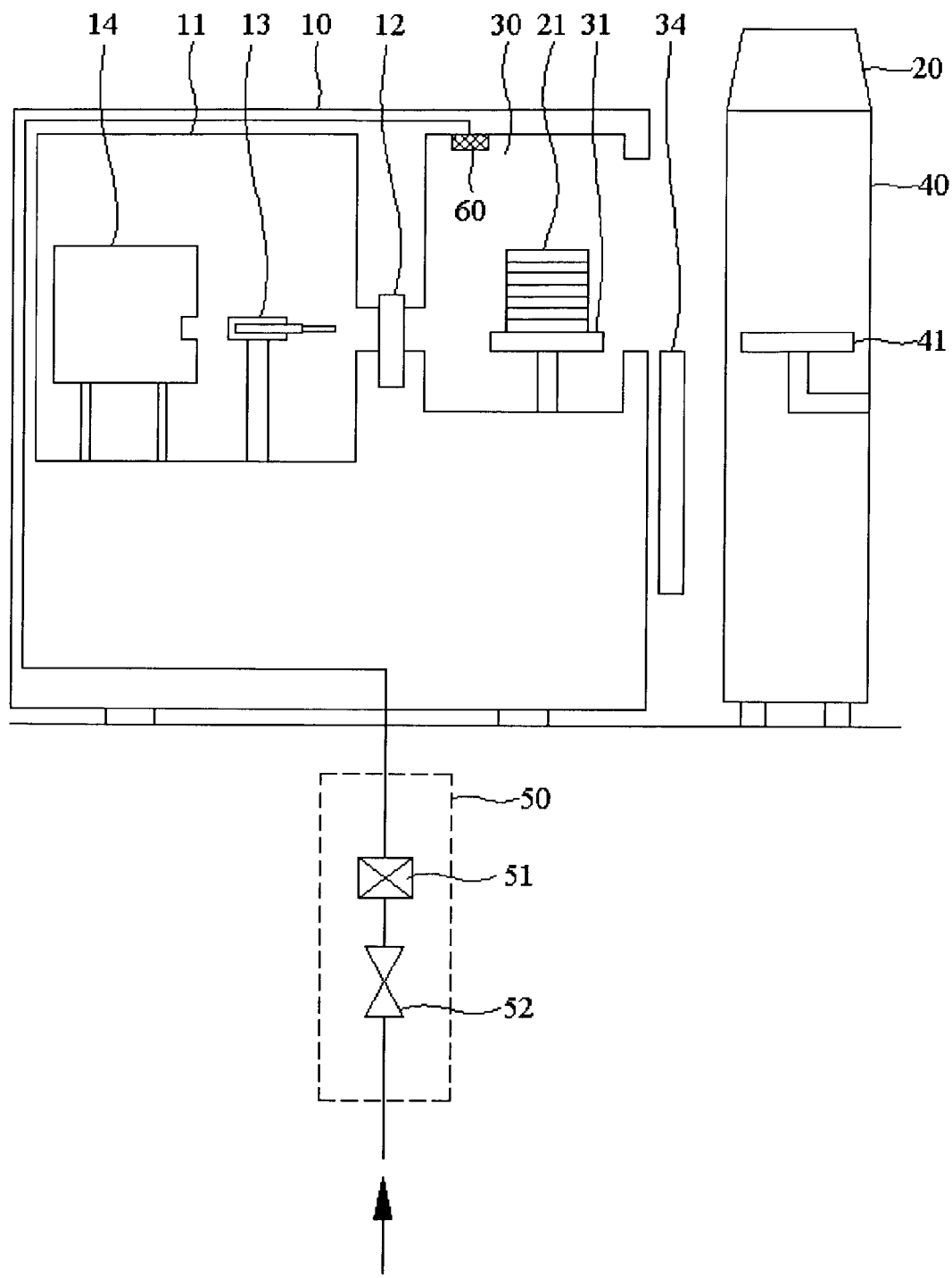
FIG. 3 is a schematic drawing of semiconductor equipment with a gas conduit of the present invention.

FIG. 3 is a schematic drawing of semiconductor equipment with an improved gas conduit of the present invention. In semiconductor factories, pod 20 are used to create mini clean chambers and are transported by workers or robots. SMIF 40 are used to deliver cassette 21 from the pod 20 to semiconductor equipment 10. In FIG. 3, after finishing the process, the wafers are delivered from the reaction chamber 14 back to the load lock chamber 30 and placed on the indexer 31. Because many semiconductor processes have to proceed in vacuum, the load lock chamber 30 must raise the pressure therein from a vacuum to 1 atm. The gas conduit 50 connected to a gas source (not shown) and semiconductor equipment 10 of the present invention includes a main pipe with a fast valve 51 and a limitative valve 52. The main pipe introduces gas from the gas source with the maximum flow rate of the fast valve 51 when breaching the vacuum. The limitative valve 52 limits the gas source pressure to a maximum predetermined pressure, (ex: 2 kg/cm$^2$), protecting the wafers from damage. When the pressure in the load lock chamber 30 is about 1 atm., the fast valve 51 closes and the gas flow stops.

In FIG. 3, the filter 60 connected to the gas conduit 50 is mounted on the top surface of the load lock chamber 30, rather than on the bottom surface as mentioned in prior art. Thus, the gas flow passing through the filter 60 does not disturb the particles deposited on the bottom surface, agitation of which may cause defects to the wafers in the load lock chamber 30. As well, the downward gas flow from the filter 60 mounted on the top surface keeps the loose particles settled on the floor of the load lock chamber 30.

Figure 4:
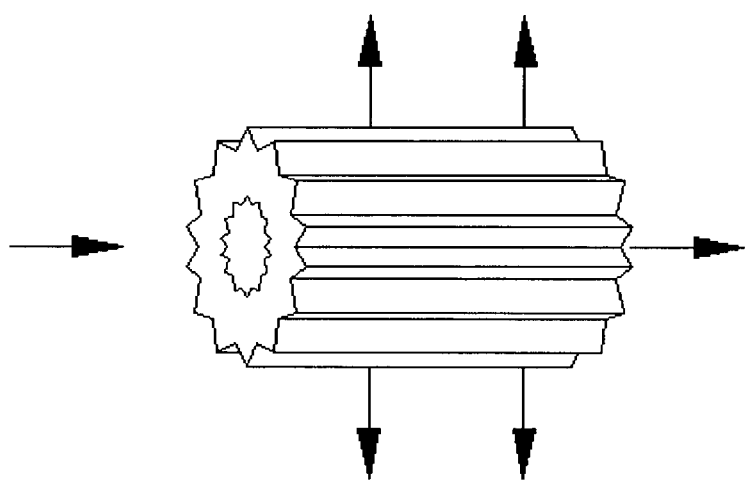
FIG. 4 is the schematic drawing of a filter in FIG. 3.

FIG. 4 is the schematic drawing of a filter in FIG. 3. In FIG. 3 and FIG. 4, the filter 60 of the present invention is fiber with tiny holes which can filter out small particles and avoid air turbulence. The filter 60 of the present invention has a plurality of folds which increase the filtering area so that the gas flow rate of the inlet gas structure 50 is also increased. Furthermore, the gas introduced to the load lock chamber 30 is clean air or nitrogen, which can protect the wafers from corrosion or oxidation.

The gas conduit 50 of the present invention introduces gas from the gas source with its maximum flow rate when breaching the vacuum. It shortens the gas introducing time and increases the output capacity. Furthermore, it avoids disturbing the particles in the load lock chamber 30, thereby improving the quality of wafers.

While the invention has been described by way of example and in terms of the preferred embodiment, it is to be understood that the invention is not limited to the disclosed embodiments. On the contrary, it is intended to cover various modifications and similar arrangements as would be apparent to those skilled in the art. Therefore, the scope of the appended claims should be accorded the broadest interpretation so as to encompass all such modifications and similar arrangements.

What is claimed is:

1. A gas conduit connected to a gas source to introduce gas into a load lock chamber of semiconductor equipment, comprising:
   a filter, mounted on the top surface of the load lock chamber;
   a pressure limitative device, to maintain a preset pressure in the load lock chamber; and
   a fast valve, including an inlet end connected to the pressure limitative device and an outlet end connected to the filter, wherein the fast valve introduces gas from the gas source into the load lock chamber with its maximum flow rate when breaching the vacuum therein.

2. The gas conduit as claimed in claim 1, wherein the filter is fiber.

3. The gas conduit as claimed in claim 2, wherein the filter has a plurality of folds to increase the area thereof.

4. The gas conduit as claimed in claim 1, wherein the pressure limitative device is a pressure limitative valve.

5. The gas conduit as claimed in claim 1, wherein the gas provided by the gas source is nitrogen.

6. The gas conduit as claimed in claim 1, wherein the gas provided by the gas source is air.

7. A load look chamber of semiconductor equipment, comprising:
   a chamber, disposed in semiconductor equipment;
   a door, disposed on the chamber to seal the chamber;
   a vacuum pump, connected the chamber to draw out the air in the chamber; and
   a gas conduit, including:
      a gas source;
      a filter, mounted on the top surface of the chamber;
      a pressure limitative device, connected to the gas source to maintain a preset pressure in the chamber; and
      a fast valve, including an inlet end connected to the pressure limitative device and an outlet end connected to the filter, wherein the fast valve introduces gas from the gas source into the chamber with the maximum flow rate thereof when breaching the vacuum therein.

8. The vacuum chamber as claimed in claim 7, further comprising:
   a loading base, disposed in the chamber to receive wafers.

9. The vacuum chamber as claimed in claim 7, wherein the fast valve is an inlet valve.

10. The vacuum chamber as claimed in claim 7, wherein the filter is fiber.

11. The vacuum chamber as claimed in claim 10, wherein the filter has a plurality of folds to increase the area thereof.

12. The vacuum chamber as claimed in claim 7, wherein the pressure limitative device is a pressure limitative valve.

13. The vacuum chamber as claimed in claim 7, wherein the gas provided by the gas source is nitrogen.

14. The vacuum chamber as claimed in claim 7, wherein the gas provided by the gas source is air.

* * * * *